(12) United States Patent
Harper, Jr.

(10) Patent No.: US 6,471,526 B1
(45) Date of Patent: Oct. 29, 2002

(54) ELECTRICAL CONNECTOR WITH STRAIN RELIEF FEATURE

(75) Inventor: Donald K. Harper, Jr., Harrisburg, PA (US)

(73) Assignee: FCI Americas Technology, Inc., Reno, NV (US)

( * ) Notice: Subject to any disclaimer, the term of this patent is extended or adjusted under 35 U.S.C. 154(b) by 0 days.

(21) Appl. No.: 09/465,164

(22) Filed: Dec. 16, 1999

(51) Int. Cl.7 ............................................. H01R 12/00
(52) U.S. Cl. ........................................... 439/83; 439/66
(58) Field of Search ............................ 439/66, 67, 83, 439/874, 86; 174/254, 257

(56) References Cited

U.S. PATENT DOCUMENTS

| | | | |
|---|---|---|---|
| 3,781,596 A | 12/1973 | Galli et al. | 317/101 F |
| 5,186,383 A | 2/1993 | Melton et al. | 228/180.2 |
| 5,205,750 A | 4/1993 | Darrow et al. | 439/77 |
| 5,381,848 A | 1/1995 | Trabucco | 164/102 |
| 5,400,950 A | 3/1995 | Myers et al. | 228/180.22 |
| 5,435,732 A | 7/1995 | Angulas et al. | 439/67 |
| 5,490,040 A | 2/1996 | Gaudenzi et al. | 361/773 |
| 5,583,376 A | 12/1996 | Sickler et al. | 257/702 |
| 5,641,946 A | 6/1997 | Shim | 174/261 |
| 5,702,255 A * | 12/1997 | Murphy et al. | 439/71 |
| 5,722,160 A | 3/1998 | Chmura et al. | 29/840 |
| 5,742,484 A | 4/1998 | Gillette et al. | 361/789 |
| 5,796,169 A | 8/1998 | Dockerty et al. | 257/780 |
| 5,859,538 A | 1/1999 | Self | 324/755 |
| 6,079,991 A | 6/2000 | Lemke et al. | 439/83 |
| 6,116,922 A | 9/2000 | Szu et al. | 439/83 |

FOREIGN PATENT DOCUMENTS

WO WO 98/15989 4/1998

OTHER PUBLICATIONS

Machinery's Handbook, p. 351, 21st Edition, Industrial Press, 1979.*

* cited by examiner

Primary Examiner—Tulsidas Patel
(74) Attorney, Agent, or Firm—Woodcock Washburn LLP (57) ABSTRACT

An electrical connector is disclosed. The electrical connector comprises a plurality of contacts that are adapted to be electrically connected to a substrate. A first body of reflowable, electrically conductive material is placed on a contact in order to provide an electrical path between the connector and the substrate. In addition, a second body of reflowable, electrically conductive material is placed on another contact. This second body provides mechanical strain relief between the connector and the substrate.

19 Claims, 9 Drawing Sheets

ELECTRICAL CONNECTOR WITH STRAIN RELIEF FEATURE

FIELD OF THE INVENTION

The present invention relates to an electrical connector. More specifically, the present invention relates to high input/output density connectors, such as surface mount connectors using ball grid array (BGA) technology.

BACKGROUND OF THE INVENTION

The recent drive for smaller, more functional electronic equipment, particularly personal portable devices, has created an ongoing need for miniaturization of all components, especially electrical connectors. Efforts to miniaturize connectors have included reducing the pitch between terminals in single or double row linear connectors. This permits a relatively larger number of connections in the ever decreasing space allotted for connectors on circuit substrates. The drive for smaller electronic equipment has also been accompanied by a recent preference for surface mount techniques (SMT) for mounting components on circuit boards. However, because reducing the pitch between terminals increases the risk of bridging adjacent solder pads during the reflow of solder paste, SMT has been pushed to its limits for high volume, low cost operations.

To satisfy the need for increased terminal density in SMT, array connectors have been proposed. In particular, as described in PCT Application No. PCT/US97/18066, filed Oct. 7, 1997, entitled High Density Connector and Method of Manufacture, incorporated herein by reference, ball grid array (BGA) connectors have become a reliable and efficient technique for mounting high density electrical connectors on substrates using SMT. BGA connectors have an insulative connector housing. One side of the connector housing has a matrix of spherical solder balls, positioned to engage the conductive paths of a circuit substrate. The opposite side of the connector housing has a corresponding matrix of contact terminals, which extend through the connector housing and connect electrically to the solder balls. These contact terminals are designed to engage another BGA connector, similarly connected to another substrate, thus permitting board-to-board interconnection. BGA connectors may be used to interconnect a number of various types of circuit substrates, including flexible circuits.

A flexible circuit is a pliable electrical conductor device in which conductive tracings are photolithographed on a base sheet of polyimide or polyester film, such as manufactured and sold by E. I. du Pont de Nemours & Co. under the trademarks "Kapton" (U.S. Pat. No. 3,781,596) or "Mylar." Because of their light weight and ability to bend and adapt to confined locations, flexible circuits are used in a variety of applications, including portable computers and portable communication devices. In addition, because of their ability to flex resiliently, flexible circuits are used on moving devices, like hard disk drives and compact disk pick-ups. Flexible circuits may be interconnected either to conventional circuit board substrates or to other flexible circuit substrates. There are a number of conventional approaches to accomplish interconnections involving flexible circuits. One conventional approach is to simply solder the flexible circuit to the substrate. This approach, however, makes assembly and disassembly impractical. A second conventional approach is to solder a connector to the flexible circuit for connection with another connector soldered onto the substrate. Presently, however, this approach limits terminal density and requires a stiffener device to be attached to the flexible circuit to withstand the mechanical forces imposed on the connector.

The recent advent of the BGA connector has overcome the problem associated with low terminal density. As a result, the BGA connector has been used in flexible circuit applications. However, because of the dynamic environment of a flexible circuit, the BGA connector was also used in conjunction with a stiffener to be able to withstand the significant mechanical forces between it and the flexible substrate. Notably, these mechanical forces may be of concern when using BGA connectors to interconnect non-flexible circuit substrates as well.

Therefore, a need exists for providing mechanical strain relief to a BGA connector system, without requiring an additional stiffener device.

SUMMARY OF THE INVENTION

The disadvantages of prior connector systems are overcome and significant advantages achieved in an electrical connector having a plurality of contacts that are adapted to be electrically connected to a substrate. A first body of reflowable, electrically conductive material is placed on a contact, in order to provide an electrical path between the connector and the substrate. In addition, a second body of reflowable, electrically conductive material is placed on another contact. This second body provides mechanical strain relief between the connector and the substrate. In an alternative embodiment, the contacts of the electrical connector may be arranged in a matrix array. In this alternative embodiment, the second body may be disposed on adjacent contacts forming one or more rows or columns in the array. In addition, the second body may be disposed on adjacent contacts located in one or more corners of the array. A method for providing mechanical strain relief to a connector system is achieved by providing an electrical connector such as described above, and mounting the electrical connector to a substrate.

BRIEF DESCRIPTION OF THE DRAWINGS

The present invention will be better understood, and its numerous objects and advantages will become apparent by reference to the following detailed description of the invention, when taken in conjunction with the following drawings where.

DETAILED DESCRIPTION OF PREFERRED EMBODIMENTS

Figure 1:
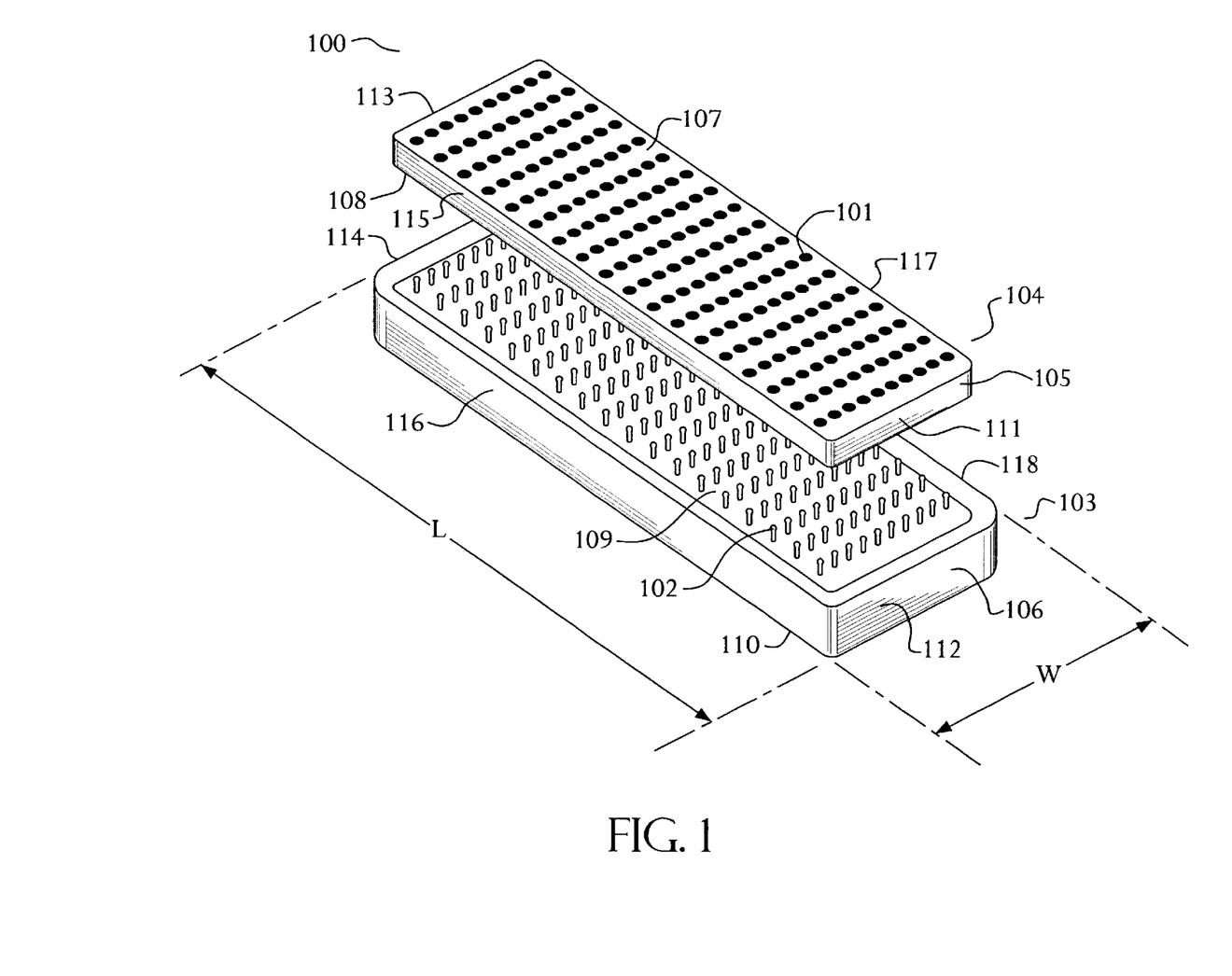
FIG. 1 is a perspective view of one embodiment of the present invention in which a plurality of contacts form a matrix array.
Figure 2:
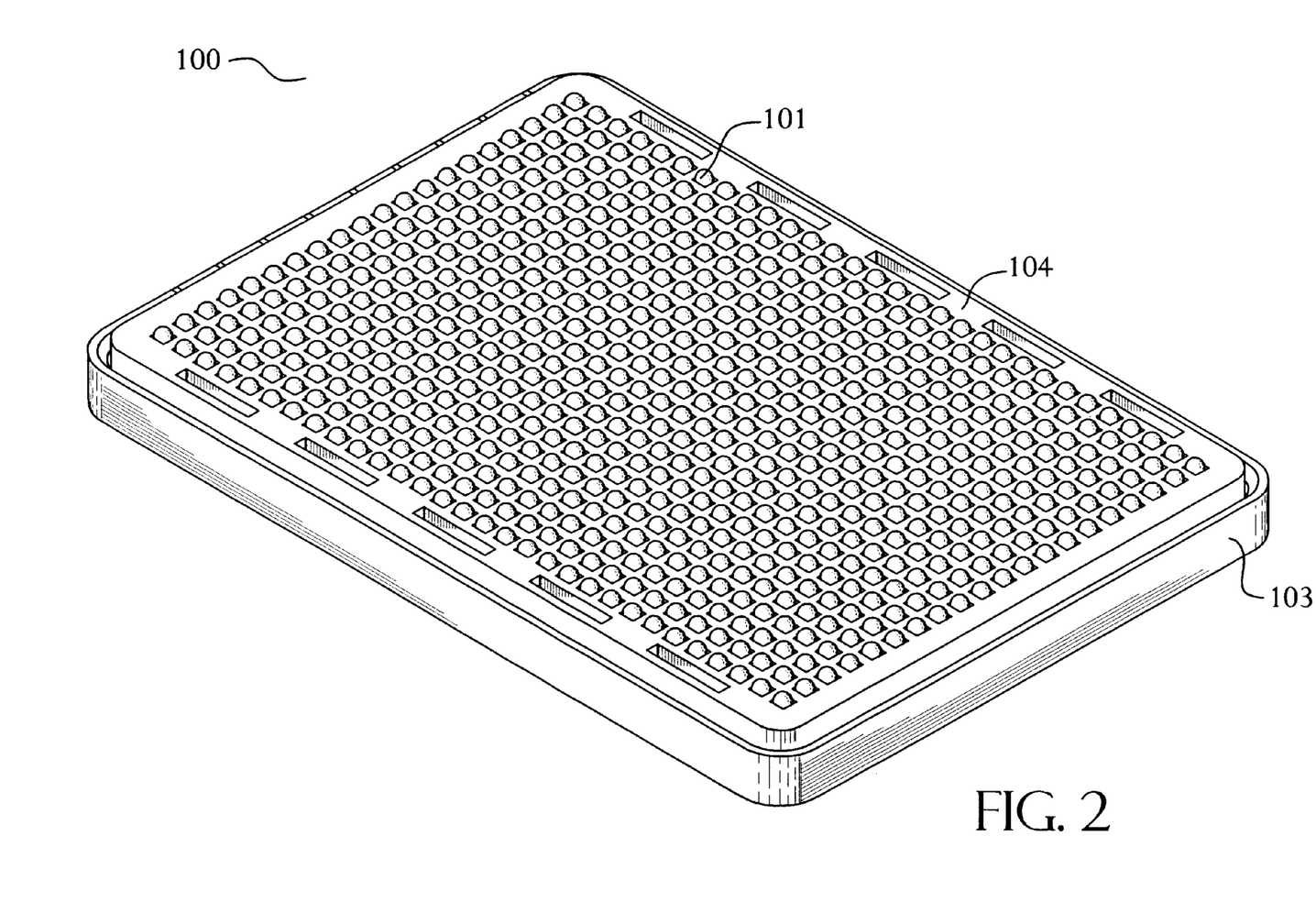
FIG. 2 is a perspective view of the embodiment depicted in FIG. 1 in a mated, closed condition.
Figure 3:
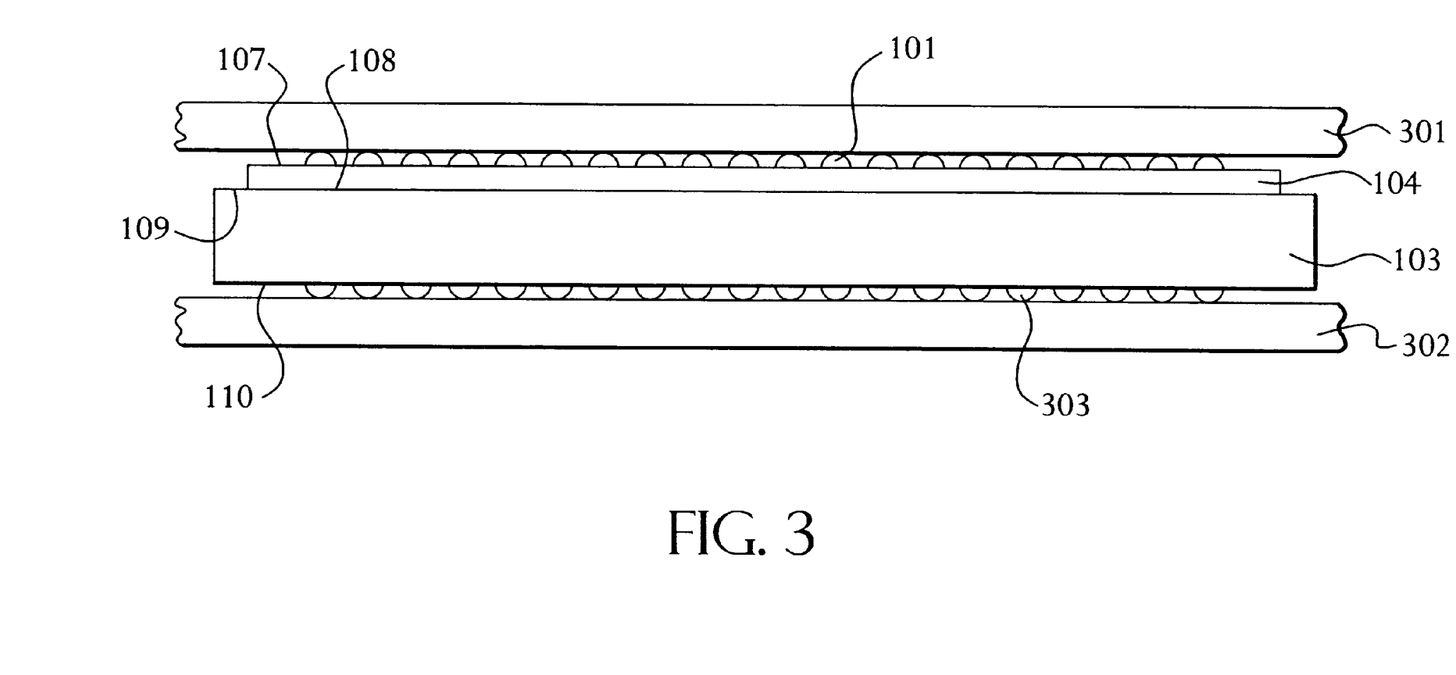
FIG. 3 is a side view of the embodiment depicted in FIG. 2.

In general, the present invention is a board-to-board electrical connector system, wherein an electrical connector is attached to a corresponding board by a plurality of solder balls, some of which provide mechanical strain relief to the connector system. FIGS. 1–3 show various views of one embodiment of the invention.

An electrical connector 100 includes a plug 104 and a receptacle 103; Plug 104 and receptacle 103 are removably engageable. Plug 104 and receptacle 103 each may have generally planar insulative housings 105 and 106, respectively. These housings. 105, 106 are preferably manufactured from an electrically non-conductive plastic, such as liquid crystal polymer (LCP). Plug 104 has a first edge 115, a second edge 117, a first side 111, and a second side 113. Similarly, receptacle 103 has a first edge 116, a second edge 118, a first side 112, and a second side 114. Connector 100 has an overall length l and an overall width w. Receptacle 103 and plug 104 typically have a peripheral wall to protect the contacts and to provide rough alignment of receptacle 103 and plug 104 during mating. Connector 100 preferably interconnects two substrates 301, 302 (as shown in FIG. 3), such as flexible printed circuit boards. Housing 105 has a mounting end 107 facing substrate 301 and a mating end 108 facing receptacle 103. Similarly, receptacle 103 has a housing 106 that has a mounting end 110 facing substrate 302 and a mating end 109 facing plug 104.

A plurality of contacts 102 extend generally perpendicular from mating end 109 of receptacle 103. Similarly, a plurality of contacts 401 (shown in FIG. 4) extend generally perpendicular from mating end 108 of plug 104. Contacts 102 which mate with contacts 401, may be any one of a number of different types, including blade-type and round pin contacts. In addition, contacts 102, 401 may include several different types of contacts in a single plug or receptacle.

Plurality of contacts 102 on receptacle 103 extend through housing 106 from mating end 109 to mounting end 110. Fusible elements, such as solder balls 303, attach to contacts 102 on mounting end 110 of housing 106. Similarly for plug 104, plurality of contacts 401 (shown in FIG. 4) extend through housing 105 from mating end 108 to mounting end 107. Fusible elements, such as solder balls 101, attach to contacts 401 on mounting end 107 of housing 105. Preferably, contacts 102,401 form a matrix array of contacts, as shown in FIGS. 1 and 2. Consequently, solder balls 101, 303 also preferably form a matrix array. As used throughout, a column refers to a group of solder balls 101,303 that extend along length l of connector 100. A row refers to a group of solder balls 101, 303 that extend along width w of connector 100.

Figure 4:
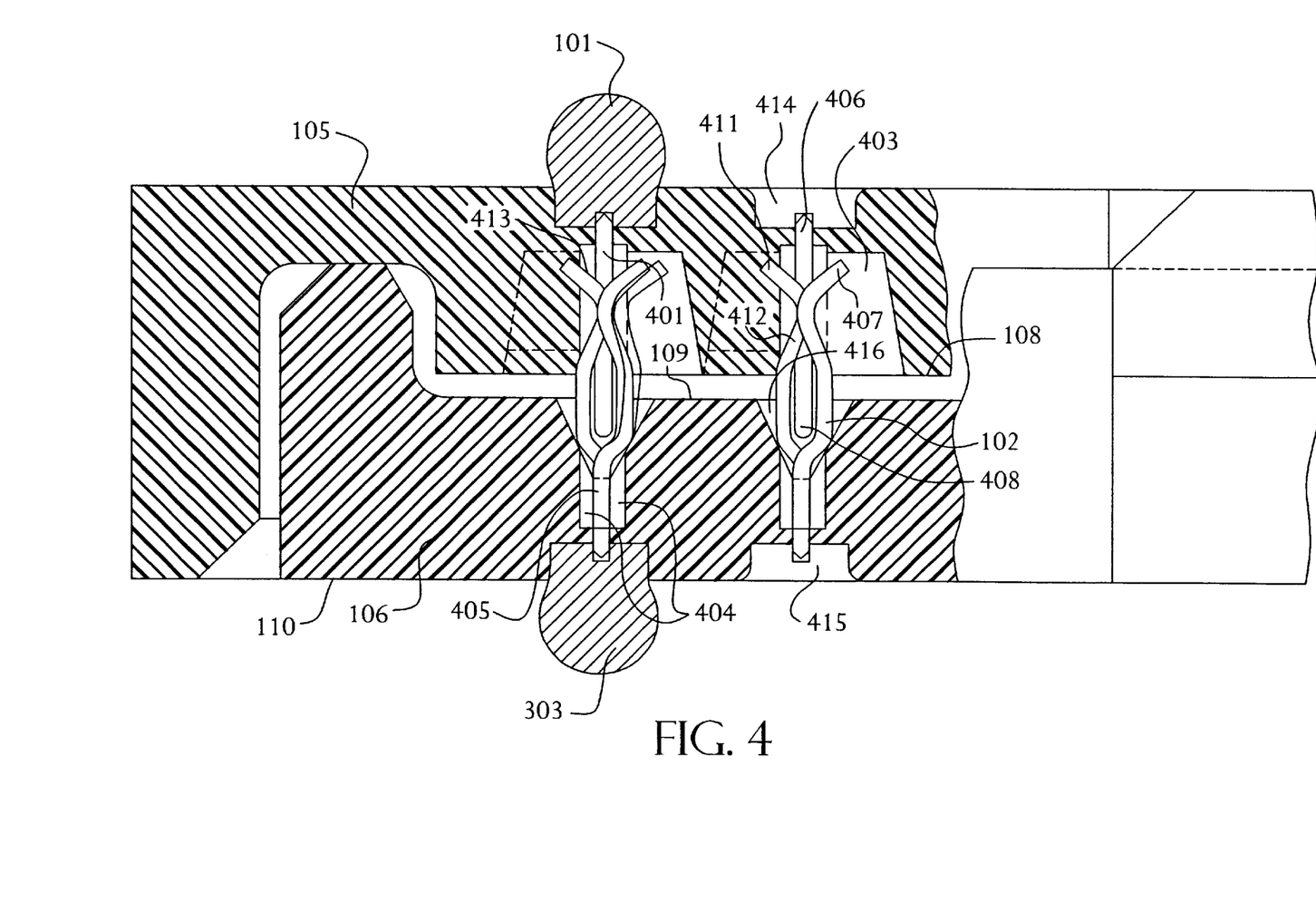
FIG. 4 is a side cross-sectional view in fragment of the alternative embodiment.

As shown in FIG. 3, plug 104 mounts to substrate 301 via solder balls 101, preferably with present reflow techniques used in Ball Grid Array (BGA) technology. Similarly, receptacle 103 mounts to substrate 302 via solder balls 303. Because contacts 102 and 401 are electrically connected to solder balls 303 and 101, respectively, when connector 100 is in a closed, mated position (as shown in FIGS. 2–4), substrate 301 is electrically interconnected to substrate 302. Preferably, either one or both of substrates 301 and 302 are flexible circuit substrates.

Referring now to FIG. 4, contacts 102 reside within apertures 404 of housing 106. Contacts 102 are held within apertures 404 by interference fit and extend generally perpendicular to mating end 108 of housing 105. Similarly, contacts 401 reside within apertures 403 of housing 105, and are held within apertures 403 by interference fit. Contacts 401 extend generally perpendicular to mating end 109 of housing 106. Contacts 102 and contacts 401 have tail portions 405 and 406, respectively. Tail portions 405 and 406 extend into recesses 415 and 416, respectively. Tail portions 405 and 406 provide an electrical connection point for solder balls 301 and 101, respectively, which may be placed in recesses 414 and 415 of housings 105 and 106, respectively. PCT Application No. PCT/US97/18066, filed Oct. 7, 1997, entitled High Density Connector and Method of Manufacture, discloses methods of securing a solder ball to a contact and of securing a solder ball to a substrate.

Contacts 102 also have upper arms 407 and 411, flexibly connected to tail portions 405 of contacts 102. Upper arms 407 and 411 have a converging section 412 and an outwardly diverging lead-in section 413. As plug 104 and receptacle 103 mate, upper portions 408 of contacts 401 flexibly engage upper arms 407 and 411 of contacts 102. Recess 416 permits upper arms 407 and 411 to outwardly flex and accept upper portions 408 of contacts 401 into outwardly diverging lead-in section 413. As a result, contacts 102 are electrically connected to contacts 401, and thus solder balls 303 are electrically connected to solder balls 101. Although FIG. 4 shows contacts 401 as blade-type contacts and contacts 102 as scissor-type contacts, it should be appreciated that they may be any one of a number of different type contacts, including round pin contacts. In addition, contacts 102,401 may include several different types of contacts in a single plug or receptacle.

Solder balls 101 and 303 may provide a variety of electrical functions, including carrying a signal, ground or power. In the present invention certain of solder balls 101 and 303 have been added to provide mechanical strain relief to the connection between substrates 301,302 and connector 100, at the same time the remainder of solder balls 101 and 303 function to provide electrical interconnection.

Although the need for such mechanical strain relief always prevails, it is of particular concern where solder balls 101, 303 are attached to substrates 301,302 that are flexible circuits. This is so because flexible circuits are bendable, and thus are used in applications where high mechanic strain is often induced on the connection between substrates 301, 302 and solder balls 101, 303. The amount and direction of the strain depend upon the particular application. The reduction of strain is unique to each application as well (depending on the operating environment and operational life requirements).

FIGS. 5–8 show plan views of various preferred arrangements of solder balls 101 on housing 105 of plug 104 designated as mechanical strain relief solder balls 501 with respect to solder balls 101 designated as electrical signaling solder balls 502. Although FIGS. 5–8 show the arrangement of solder balls 101 on plug 104, it should be appreciated that the same configuration may be present for solder balls 303 on housing 106 of receptacle 103. In each of the figures, mechanical strain relief solder balls 501 located on plug 104 are shown filled-in or solid, while electrical signaling solder balls 502 are shown without fill or hollow. Although FIGS. 5–8 designate solder balls 101 as either mechanical strain relief solder balls 501 or electrical signaling solder balls 502 it should be appreciated that a portion of solder balls 101 may have no function whatsoever. Moreover, while FIG. 4 shows solder balls 101 and 303 attached to corresponding contacts 102 and 401, respectively, it should be appreciated that mechanical strain relief solder balls 501 may not be required to be attached to contacts 102 and 401, but may be secured to housings 105, 106 by other mounting techniques.

Figure 5:
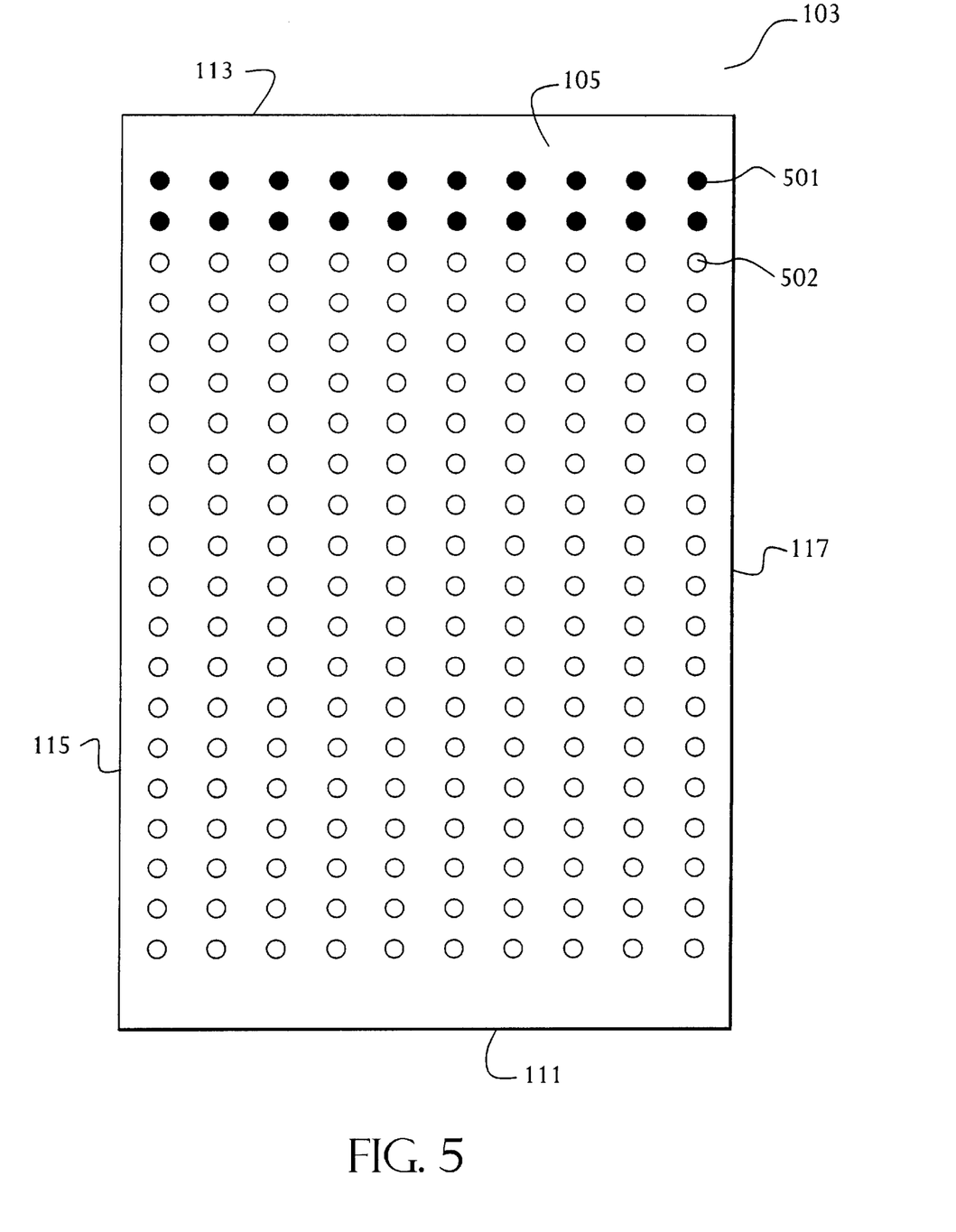
FIG. 5 is a plan view of a preferred embodiment according to the invention.
Figure 6:
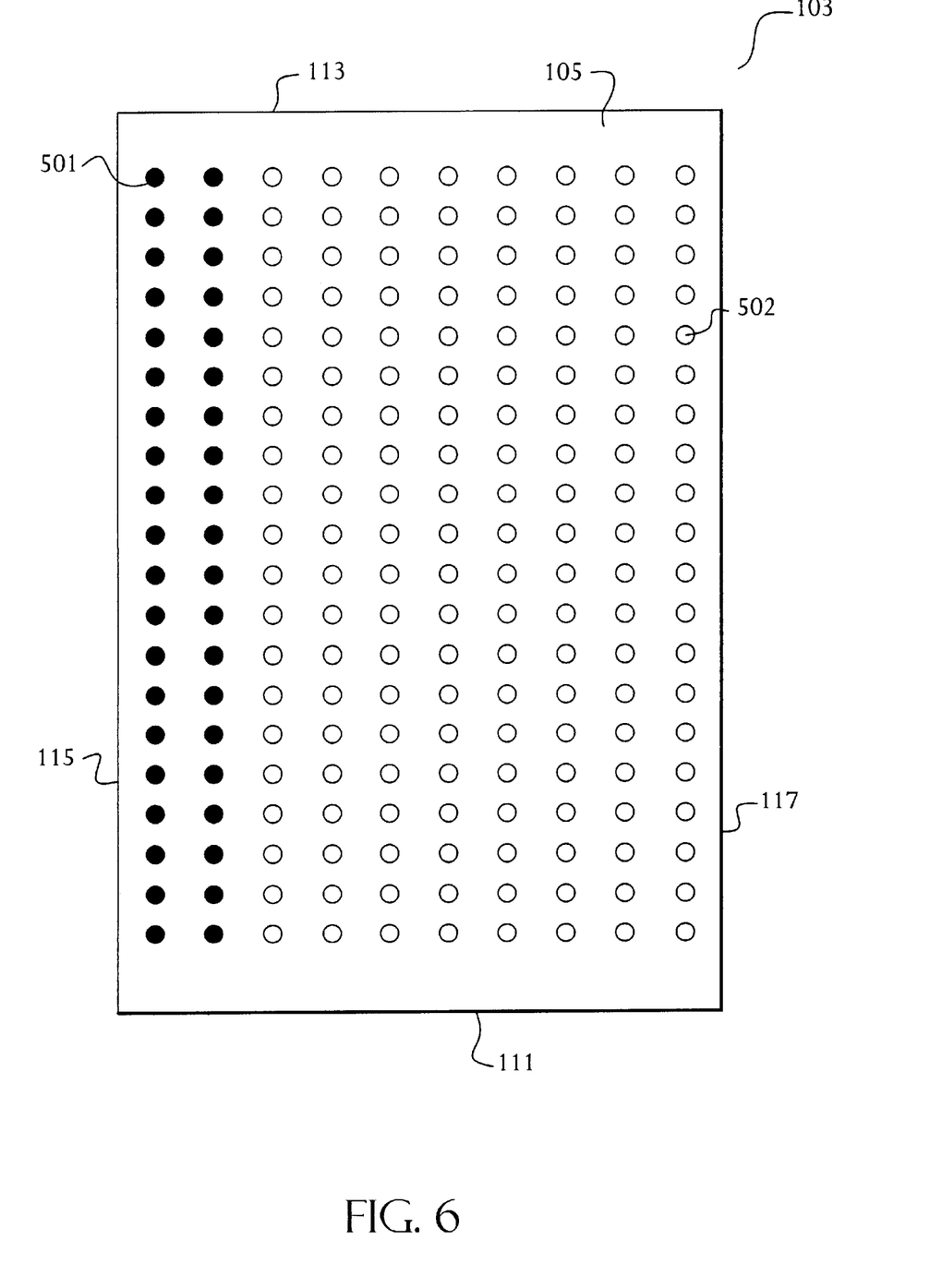
FIG. 6 is a plan view of another preferred embodiment according to the invention.
Figure 7:
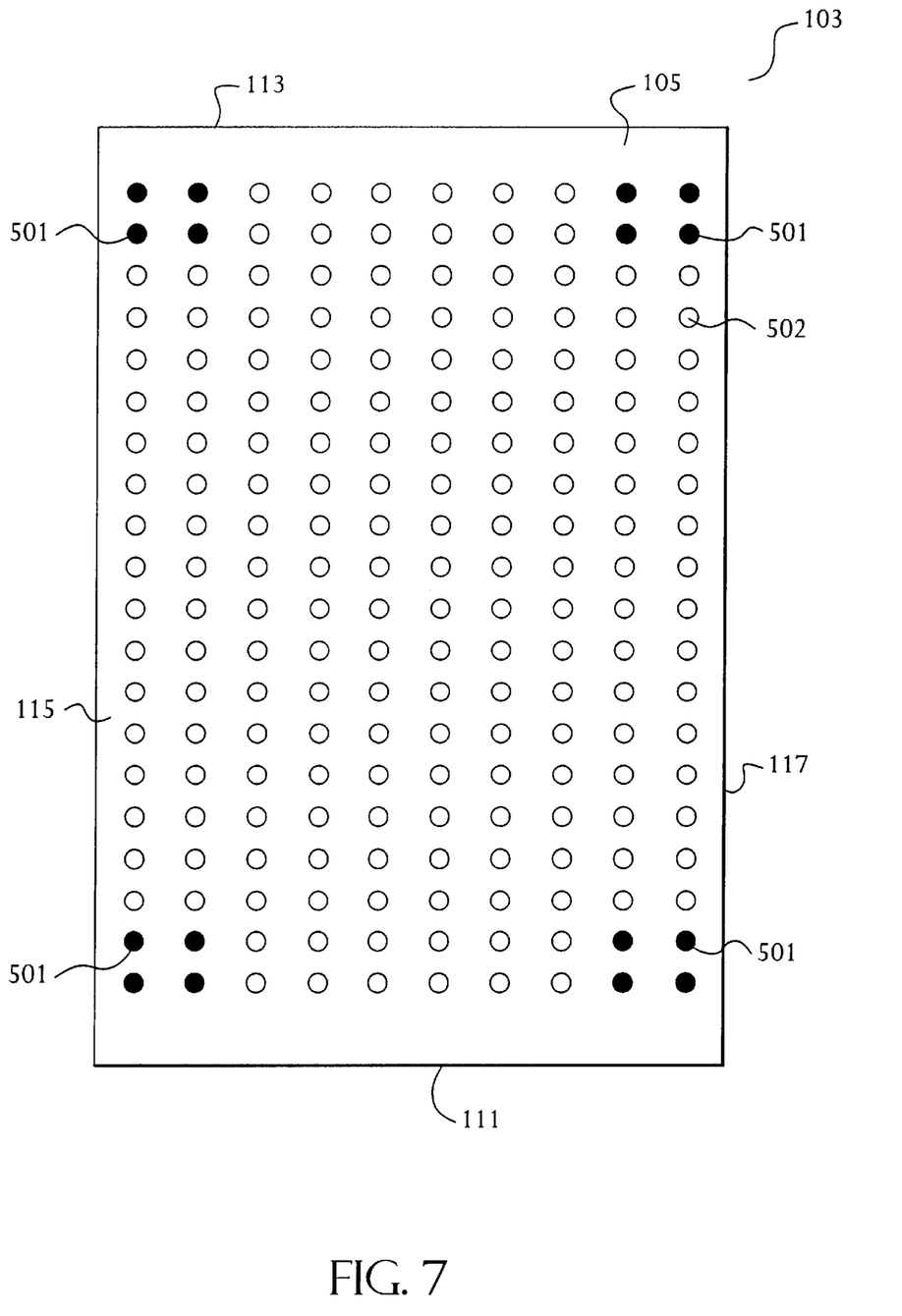
FIG. 7 is a plan view of another preferred embodiment according to the invention.
Figure 8:
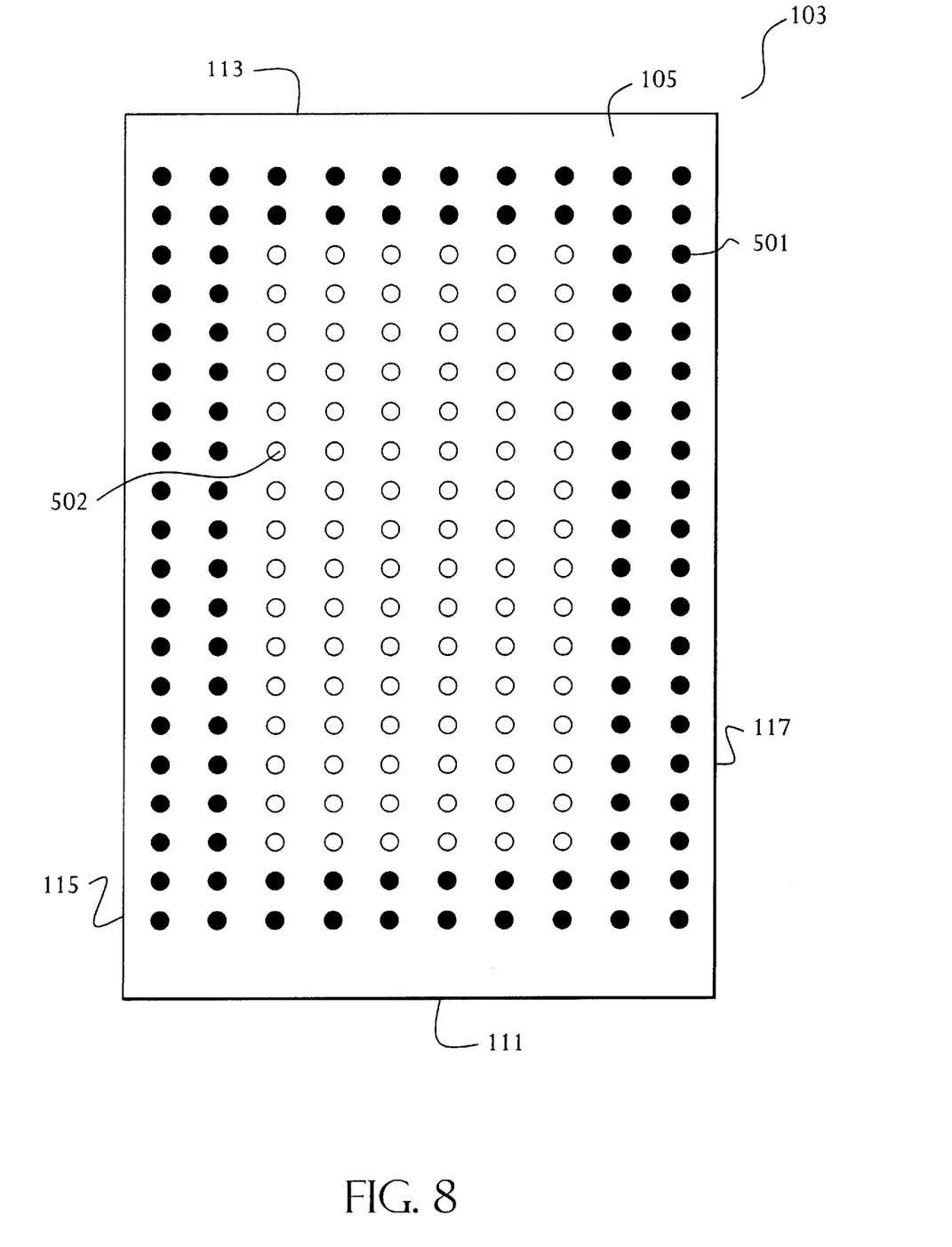
FIG. 8 is a plan view of another preferred embodiment according to the invention.

FIG. 5 shows mechanical strain relief solder balls 501 arranged along two rows nearest second side 113 of plug 104. FIG. 6 shows mechanical strain relief solder balls 501 arranged along two columns nearest first edge 115 of plug 104 and receptacle 103. FIG. 7 shows mechanical strain relief solder balls 501 grouped in corners of plug 104 and receptacle 103. Although FIG. 7 shows mechanical strain relief solder balls 501 located in every corner of plug 104, it should be appreciated that mechanical strain relief solder balls 501 may be grouped in any one or more of the corners, depending on the specific application of the connector system (i.e., depending on the particular strain relief desired). Finally, FIG. 8 shows mechanical strain relief solder balls 501 located around a periphery of electrical signal solder balls 502. The arrangement of mechanical strain relief solder balls 501 shown in FIG. 8 permits mechanical strain relief for the connector system in all directions. Deciding which arrangement is most preferred is determined by considering which part of the plug will undergo mechanical strain first, and placing mechanical strain relief solder balls 501 thereon.

Figure 9:
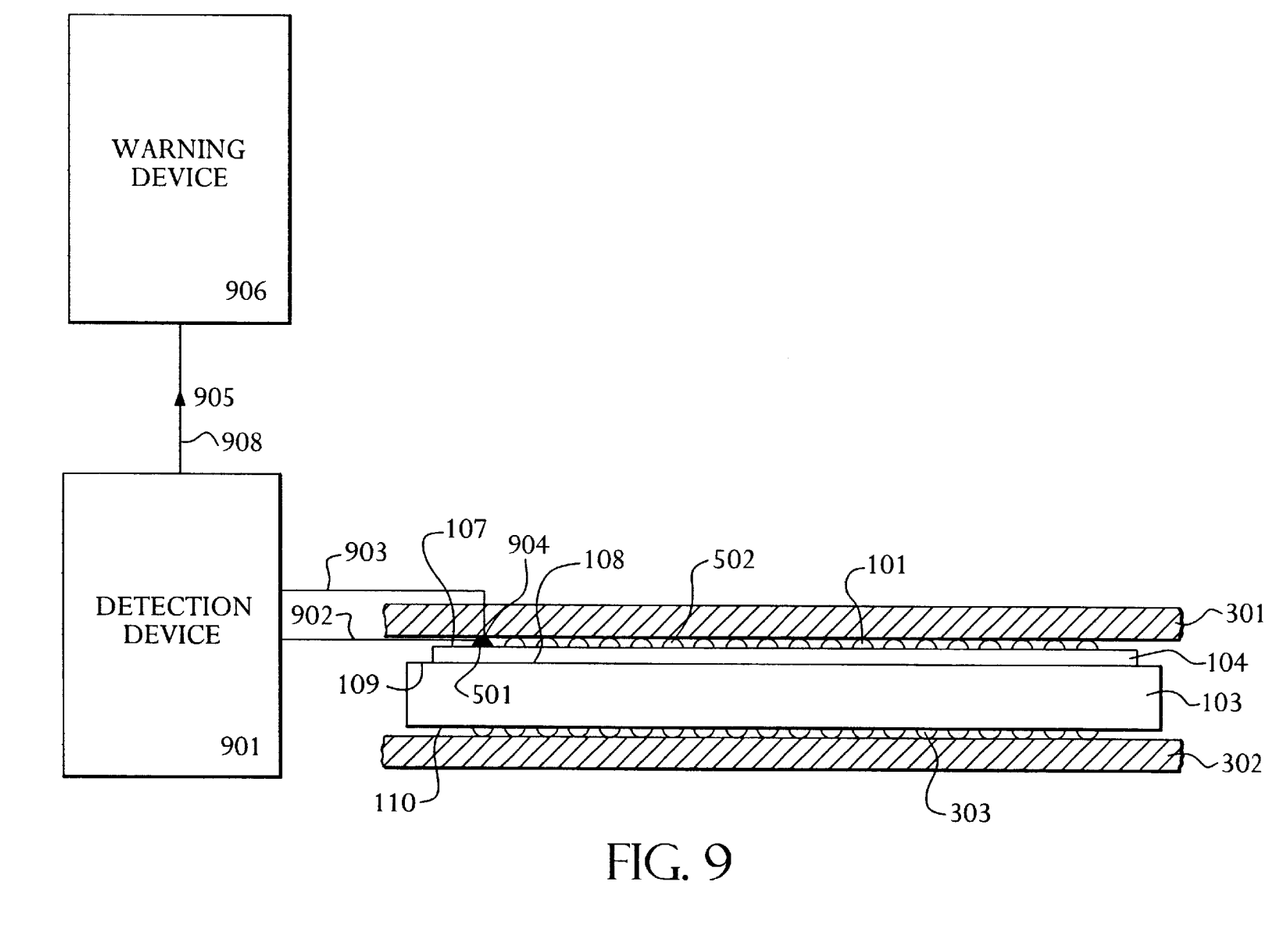
FIG. 9 is a block diagram of a detection device coupled to at least one contact in a preferred embodiment.

FIG. 9 is a block diagram of a detection device coupled to the connector system. In particular, a detection device 901 is coupled to mechanical strain relief solder ball 501 by a first conductor 902. Detection device 901 also is coupled to substrate 301 by a second conductor 903, at connection point 904, which is located between substrate 301 and mechanical strain relief solder ball 501. When mechanical strain relief solder ball 501 separates from substrate 301, detection device 901 detects an open circuit. Detection device 901 may then send a signal 905 over a third conductor 908 to a warning device 906, so as to notify a user that mechanical strain soon may cause electrical signal solder balls 502 to separate from substrate 301 as well, thus allowing the user to prevent a board-to-board electrical disconnection.

Although FIG. 9 shows detection device 901 external to substrate 301, it should be appreciated that detection device 901 may be integrated on substrate 301. In addition, although detection device 901 is shown coupled to substrate 301 and mechanical strain relief solder ball 501 only, it should be appreciated that detection device 901 may be coupled to substrate 301 and other mechanical strain relief solder balls attached thereto (not shown). Finally, although FIG. 9 shows detection device 901 coupled to one mechanical strain relief solder ball 501, it should be appreciated that detection device 901 may be coupled to a plurality of mechanical strain relief solder balls 501, as required by the specific application of the connector system.

Those skilled in the art will appreciate that numerous changes and modifications may be made to the preferred embodiments of the invention and that such changes and modifications may be made without departing from the spirit of the invention. For example, it should be understood that solder balls 101, 303 may be placed in numerous arrangements, including the demonstrated matrix array. It should also be understood that FIGS. 5–8 demonstrate just a few of the many possible configurations of mechanical strain relief solder balls 501. It is therefore intended that the appended claims cover all such equivalent variations as fall within the true spirit and scope of the invention.

I claim:

1. An electrical connector mountable to a substrate, said connector comprising:

a housing; and a plurality of contacts having bodies of reflowable, electrically conductive material disposed thereon for mounting said connector to said substrate, wherein said bodies of reflowable, electrically conductive material have substantially similar dimensions, and wherein a first group of said contacts conducts electrical signals to said substrate through said bodies, and wherein a second group of said contacts provides mechanical strain relief between said connector and said substrate through said bodies and does not conduct said electrical signals.

2. The electrical connector of claim 1, wherein said second group of said contacts are peripheral to said first group of said contacts.

3. The electrical connector of claim 1, wherein said second group of said contacts are positioned adjacent to an edge of said connector.

4. An electrical connector mountable to a substrate, said connector comprising:

a housing;

a plurality of contacts having bodies of reflowable, electrically conductive material disposed thereon for mounting said connector to said substrate, wherein said bodies of reflowable, electrically conductive material have substantially similar dimensions, and wherein a first group of said contacts conducts electrical signals to said substrate through said bodies, and wherein a second group of said contacts provides mechanical strain relief between said connector and said substrate through said bodies and does not conduct said electrical signals; and a device coupled to said second group of said contacts for detecting when one or more bodies of said second group of said contacts separate from said substrate.

5. The electrical connector of claim 1, wherein said plurality of contacts form a matrix array.

6. The electrical connector of claim 5, wherein said second group of said contacts are a part of said matrix array.

7. The electrical connector of claim 5, wherein said second group of said contacts are positioned on one or more rows of said matrix array.

8. The electrical connector of claim 5, wherein said second group of said contacts are positioned on one or more columns of said matrix array.

9. The electrical connector of claim 5, wherein said second group of said contacts are located in one or more corners of said matrix array.

10. A device, comprising:

a substrate; and an electrical connector attached to said substrate, wherein said electrical connector comprises:

a housing, and a plurality of contacts having bodies of reflowable, electrically conductive material disposed thereon for mounting said connector to said substrate, wherein said bodies of reflowable, electrically conductive material have substantially similar dimensions, and wherein a first group of said contacts conducts electrical signals to said substrate through said bodies, and wherein a second group of said contacts provides mechanical strain relief between said connector and said substrate through said bodies and does not conduct said electrical signals.

11. The device of claim 10, wherein said second group of said contacts are peripheral said first group of said contacts.

12. The device of claim 10, wherein said second group of contacts are positioned adjacent to an edge of said connector.

13. A device for detecting strain relief on an electrical connector, comprising:

a substrate;

an electrical connector attached to said substrate, wherein said electrical connector comprises:

a housing, and a plurality of contacts having bodies of reflowable, electrically conductive material disposed thereon for mounting said connector to said substrate, wherein said bodies have substantially similar dimensions, and wherein a first group of said contacts conducts electrical signals to said substrate through said bodies, and wherein a second group of said contacts provides mechanical strain relief between said connector and said substrate through said bodies and does not conduct said electrical signals; and a device coupled to said second group of said contacts for detecting when one or more bodies of said second group of said contacts separate from said substrate.

14. The device of claim 10, wherein said plurality of contacts forms a matrix array.

15. The device of claim 14, wherein said second group of said contacts are a part of said matrix array.

16. The device of claim 14, wherein said second group of said contacts are positioned on one or more rows of said matrix array.

17. The device of claim 14, wherein said second group of said contacts are positioned on one or more columns of said matrix array.

18. The device of claim 14, wherein said second group of said contacts are located in one or more corners of said matrix array.

19. An electrical connector mountable to a substrate, said connector comprising:

a housing having a first group of openings and a second group of openings;

a first body of reflowable, electrically conductive material attached to a first group of contacts in said first group of openings, wherein said first body of reflowable, electrically conductive material conducts electrical signals to said substrate; and a second body of reflowable, electrically conductive material attached to said second group of openings, wherein said second body of reflowable, electrically conductive material does not conduct said electrical signals, and wherein said first and second bodies of reflowable, electrically conductive material have substantially similar dimensions.

* * * * *